(12) United States Patent
Karim et al.

(10) Patent No.: US 6,643,821 B2
(45) Date of Patent: Nov. 4, 2003

(54) METHOD AND DEVICE FOR COMPUTING INCREMENTAL CHECKSUMS

(75) Inventors: Faraydon O. Karim, San Diego, CA (US); Kartik V. Talsania, Poway, CA (US); Vincent E. Wass, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 416 days.

(21) Appl. No.: 09/726,927

(22) Filed: Nov. 30, 2000

(65) Prior Publication Data

US 2002/0095642 A1 Jul. 18, 2002

(51) Int. Cl.⁷ .................................. G06F 11/00
(52) U.S. Cl. ........................ 714/801; 714/807
(58) Field of Search .................... 714/776, 807, 714/52, 801; 370/252; 709/236; 708/700

(56) References Cited

U.S. PATENT DOCUMENTS

| | | | | |
|---|---|---|---|---|
| 4,712,215 A | * | 12/1987 | Joshi et al. | 714/776 |
| 5,500,864 A | * | 3/1996 | Gonia et al. | 714/807 |
| 5,630,054 A | * | 5/1997 | Trang | 714/52 |
| 5,663,952 A | * | 9/1997 | Gentry, Jr. | 370/252 |
| 5,701,316 A | * | 12/1997 | Alferness et al. | 714/807 |
| 5,826,032 A | * | 10/1998 | Finn et al. | 709/236 |
| 5,912,909 A | * | 6/1999 | McCoy | 714/807 |
| 6,343,306 B1 | * | 1/2002 | Lo | 708/700 |

OTHER PUBLICATIONS

Braden, R., RFC 1071 "Computing the Internet Checksum", 1988.

* cited by examiner

*Primary Examiner*—David Ton
(74) *Attorney, Agent, or Firm*—Stephen Bongini; Lisa K. Jorgenson

(57) ABSTRACT

A method and a computing system compute an incremental checksum corresponding to a data packet. The incremental checksum is computed within one processor cycle of a processor. A first register (102) stores first checksum information corresponding to a data packet. A second register (104) stores second checksum information corresponding to old information being deleted from the data packet. A third register (106) stores third checksum information corresponding to new information being added to the data packet. An incremental checksum circuit (100), electrically connected to the first register (102), to the second register (104), and to the third register (106), provides resulting checksum information corresponding to the data packet after deleting the old information from the data packet and adding the new information to the data packet. The resulting checksum information is selectively stored in the first register (102).

20 Claims, 4 Drawing Sheets

| A | B | C | Sum | Carry |
|---|---|---|-----|-------|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Table 1: Truth Table

METHOD AND DEVICE FOR COMPUTING INCREMENTAL CHECKSUMS

BACKGROUND OF THE INVENTION

1. Field of the Invention

This invention relates in general to digital computing and communication systems, and more particularly to a method for computing incremental checksums for a data packet such as for processing communication packets of information.

2. Description of Related Art

Modern computing systems typically operate using error detection mechanisms such as checksums to maintain integrity of data words. This is particularly important for the higher error rates of network communication systems including wired and wireless communication systems. Communication systems, such as used in wired networks, the Internet, and wireless communication, process information that is typically organized as data packets and that needs to have data integrity checking. Devices in a communication system, such as network routers, repeaters, and relay stations, normally must quickly analyze received data packets to determine the integrity of the data packets. Additionally, if the devices make any changes to bits of information in the data packets then the device has to update the checksum information for such data packets. A common way to change the checksum information corresponding to a data packet is known as an incremental checksum. This incremental checksum process is often a software-based task. The task has to be performed at nearly the speed of the communication channel to maintain a throughput in a communication system. In a very high speed communication system, for example such as the Internet, the data packets may be processed at up to 30 million packets per second. A bit rate of 10 gigabits per second is not uncommon in processing data packets in such a network.

Accordingly, it is imperative that any operation on the bits of any data packet in such a high speed communication system must be very fast and efficient to keep up with the communication bit rate for such data packets. The speed of computing the incremental checksum, therefore, must be kept to nearly the bit rate of the communication of the data packets to minimize the impact on the speed of communication of the data packets across the network.

The incremental checksum operation is considered an integrated part of any networking system. One of the most widely used applications utilizing such checksum operation is IP Forwarding. An IP packet, for example, contains within it a checksum field, typically in its IP Header. This checksum field is used to help detect bit errors in data packets, due typically to unwanted noise in a communication medium. Understanding the fact that an IP router processes approximately 30 million packets per second on a high speed network link, one can see the importance of verifying the checksum value for each packet as they arrive. Once the checksum value is verified, an IP router may choose to edit part of an IP Header. Such a change requires the IP router to re-compute the checksum field. The incremental checksum operation is considered an optimal solution for such a problem. See, for example, the publication RFC 1071 "Computing the Internet Checksum," R. Braden, 1988, A description of this well known incremental checksum operation follows.

(1) Consider a packet P with a checksum value of C, in its IP Header.
(2) Now lets say that a router changes part of IP Header X to X'.
(3) Incremental checksum states that, in order to compute new checksum value C'—one would subtract old information X from the checksum value C and then add in the new information X', in order to acquire the new checksum value, NC. Please note that all additions are considered to be one's complement additions.

This means that a computing system has to perform an addition and a subtraction for every time a packet passes through an IP router. Conventionally, this operation is performed with the assistance of two software instructions. Below is a sample assembly code for a computing device to operate the Incremental Checksum.

Assume the following usage of registers:
 (1) R1=old checksum
 (2) R2=new checksum
 (3) R3=old information
 (4) R4=new information sub R1, R1, R3
add R2, R1, R4

Assuming that each of these instructions above takes one processor cycle to complete, performing the incremental checksum algorithm will take two processor cycles. However, due to the data dependency on register R1, one needs to stall for an extra cycle—resulting in 3 cycles to complete the incremental checksum operation. One could try to avoid this extra cycle penalty by performing data forwarding in order to resolve any data dependency issues. We know that a high speed IP router processes 30 million packets per second. This means that every second it executes (30 million packets/second * 2 cycles/packet)=60 million cycles per second. In order to perform IP Forwarding at near "wire speed", it is necessary to cut down the number of processor cycles used to perform the checksum operation.

Thus, there is a need to overcome the disadvantages of the prior art, such as discussed above, and in particular to improve the processing speed of incremental checksum operations in computing systems such as required for high speed communication of data packets.

DETAILED DESCRIPTION OF THE PREFERRED EMBODIMENTS

Figure 1:
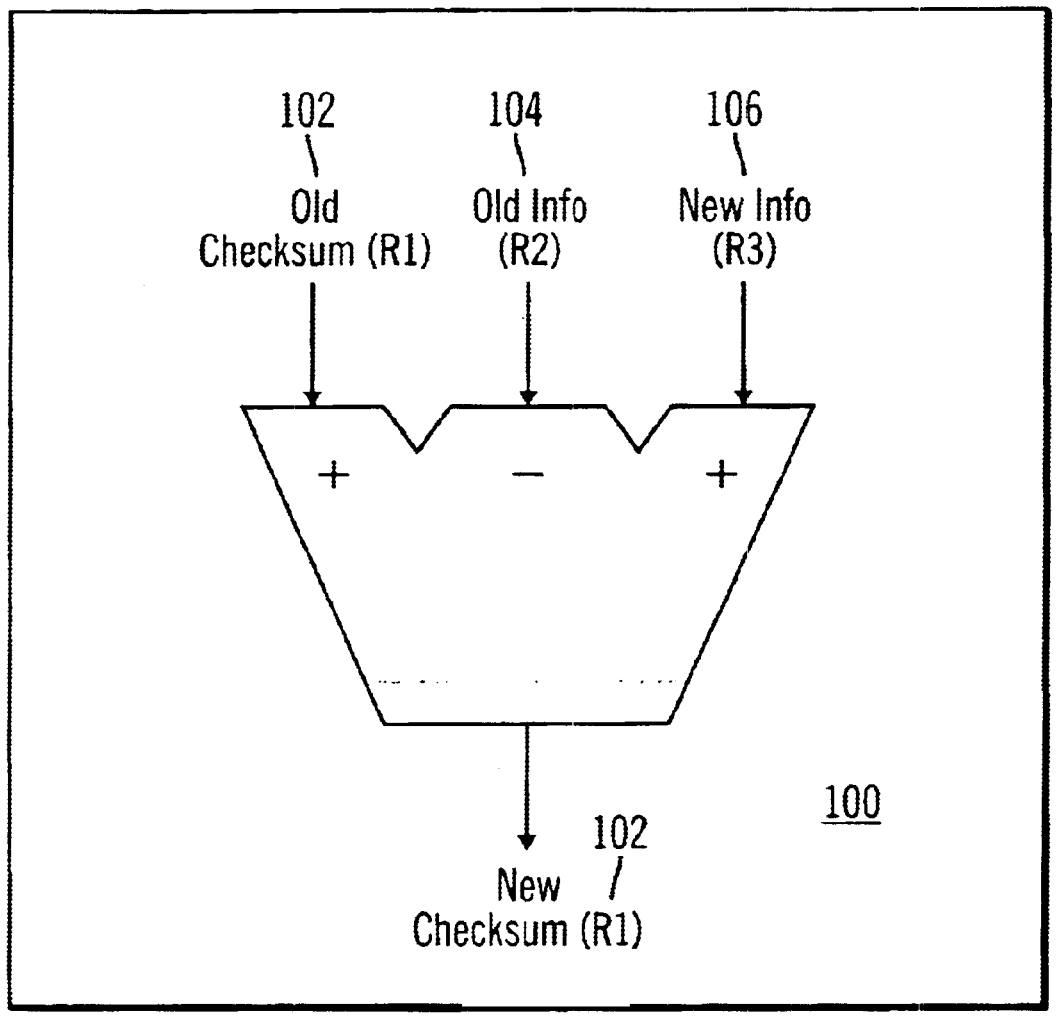
FIG. 1 is a high level circuit block diagram illustrating an incremental checksum computing device, in accordance with a preferred embodiment of the present invention.

The present invention offers significant advantages over the prior art. In prior art computing systems, conventional software implementations for computing incremental checksum require twice as many processor cycles to arrive at a desired result as may be used by a preferred embodiment of the present invention.

The present invention can reduce the number of processor cycles used to perform the Incremental Checksum algorithm by 50% from prior art system implementations. A preferred embodiment of the present invention provides a single instruction that performs both the addition and subtraction operations in a single processor cycle. This is a significant advantage over the known prior art systems. This provides computing systems utilizing a preferred embodiment of the present invention the advantage of cutting down the number of processor cycles from 60 million/second to 30 million/second. The following is an example of the specialized instruction.

Assume the following usage of registers:
(1) R1=old/new checksum
(2) R2=old information
(3) R3=new information
schkss R1, R2, R3

This instruction subtracts R2 from R1, thereby removing the old information from the checksum and then adding R3 to that new value, thereby inserting new information—i.e. R1=(R1−R2)+R3.

Three Main Advantages with Respect to Prior Art
1) Performance

A key advantage of the new and novel method and device, in respect to the traditional method of computing checksum, is performance. Traditional methods perform incremental checksum operations at minimum of two processor cycles/second. A high speed IP router processing 30 million packets/second, carries out:

(2 cycles/packet * 30 million packets/second)=60 million cycles/second.

This number is significantly reduced in half by using the new method of computing the checksum—for it calculates the new checksum value in one cycle, benchmarking at:

(1 cycle/packet * 30 million packets/second)=30 million cycles/second for a high speed IP router.

As seen from the above illustration, this method allows an incremental checksum to be computed in one cycle instead of two cycles—saving millions of cycles, for a high speed IP router or network processor performing IP Forwarding, that are now available for performing other significant tasks.

2) Power Reduction

Another significant advantage of this technique is the reduction in power usage. Let us first analyze the power consumption by the traditional method of computing checksum.

sub R1, R1, R3 (two register reads, one register write)
add R2, R1, R4 (two register reads, one register write)

We notice, in order to perform these instructions we need to make a total of four read and two writes. On an average a read consumes 15% more power than a write due to recharging of the register after the read has taken place, i.e.—read=(write * 1.15). Therefore, you have a total of: (r=read power, w=write power)

$$4r + 2w - \text{Old Power Consumption}$$
$$= 4(w * 1.15) + 2w$$
$$= 6.6 \text{ write power/checksum (packet)}$$

Given the fact that a high speed IP router processes 30 million packets/second, the traditional method of performing checksum will use a total of (6.6 writes/packet * 30 million packets/second)=198 million write power/second. Now, to illustrate the reduction of power usage, we take the new methodology:

schkss R1, R2, R3 (three register reads, one register write)

Given the same assumption, i.e.—read=(write * 1.15), we have the following:

$$3r + 1w - \text{New Power Consumption}$$
$$= 3(w * 1.15) + 1w$$
$$= 4.45 \text{ write power/checksum (packet)}$$

The new methodology consumes (4.45 write power/packet * 30 million packets/second) =133.5 million write power/second—a reduction of (198 million write power/second− 133.5 million write power/second)=64.5 million write power/second. This is considered an enormous savings in power.

3) Integrated Circuit Application

The incremental checksum operation, in accordance with a preferred embodiment of the present invention, can be implemented in an integrated circuit to benefit from a circuit application that is particularly suited for fast and energy efficient operation. Incremental checksums are such a central part of networking applications that by dedicating a fast circuit implementation that is solely characterized for the new and novel incremental checksum operation, as discussed above, can both double performance and significantly reduce power consumption for computing systems that include the present invention. This makes this invention very unique to computing systems and particularly valuable for high speed communication systems.

Description of an Incremental Checksum Device and Method

FIG. 1 illustrates an incremental checksum device 100 according to a preferred embodiment of the present invention. A first register 102 stores a checksum corresponding to a data packet before performing an incremental checksum operation. Note that a data packet is broadly defined to include any type of data structure that represents a collection of data and for which an integrity check is maintained by using a checksum. For example, and without limitation, a data packet may comprise a data word, a data base record, a field for a data base record, a communication data codeword, a field of information in a communication data packet, or an entire data packet. Additionally, the term register is used here only for the example where a processor in a computing system would likely benefit from close coupling to a memory device, such as a register, for use in computing the incremental checksum operation. However, note that any suitable memory device would be likewise capable of storing the checksum information for use in the incremental checksum operation.

Continuing on with the present example, the second register 104 stores checksum information corresponding to old information being deleted from the data packet. A third register 106 stores checksum information corresponding to new information being added to the data packet. Note that the data packet could be of any size as may be used in a computing system and/or a communication system. The incremental checksum device 100 adds the contents of register one 102 with the contents of register three 106 and subtracts the contents of register two 104, all within one processor cycle. The result of the incremental checksum operation is stored in register one 102. The result, according to a preferred embodiment, can be selectively stored in register one 102 upon a selection of a processor that operates with the incremental checksum device 100. Of course, alternative memory devices to store the result may be contemplated by those of ordinary skill in the art in view of the discussion above. This fast and energy efficient incremental checksum computation can compute the incremental checksum within one processor cycle which is a significant advantage of the present invention.

Figure 2:
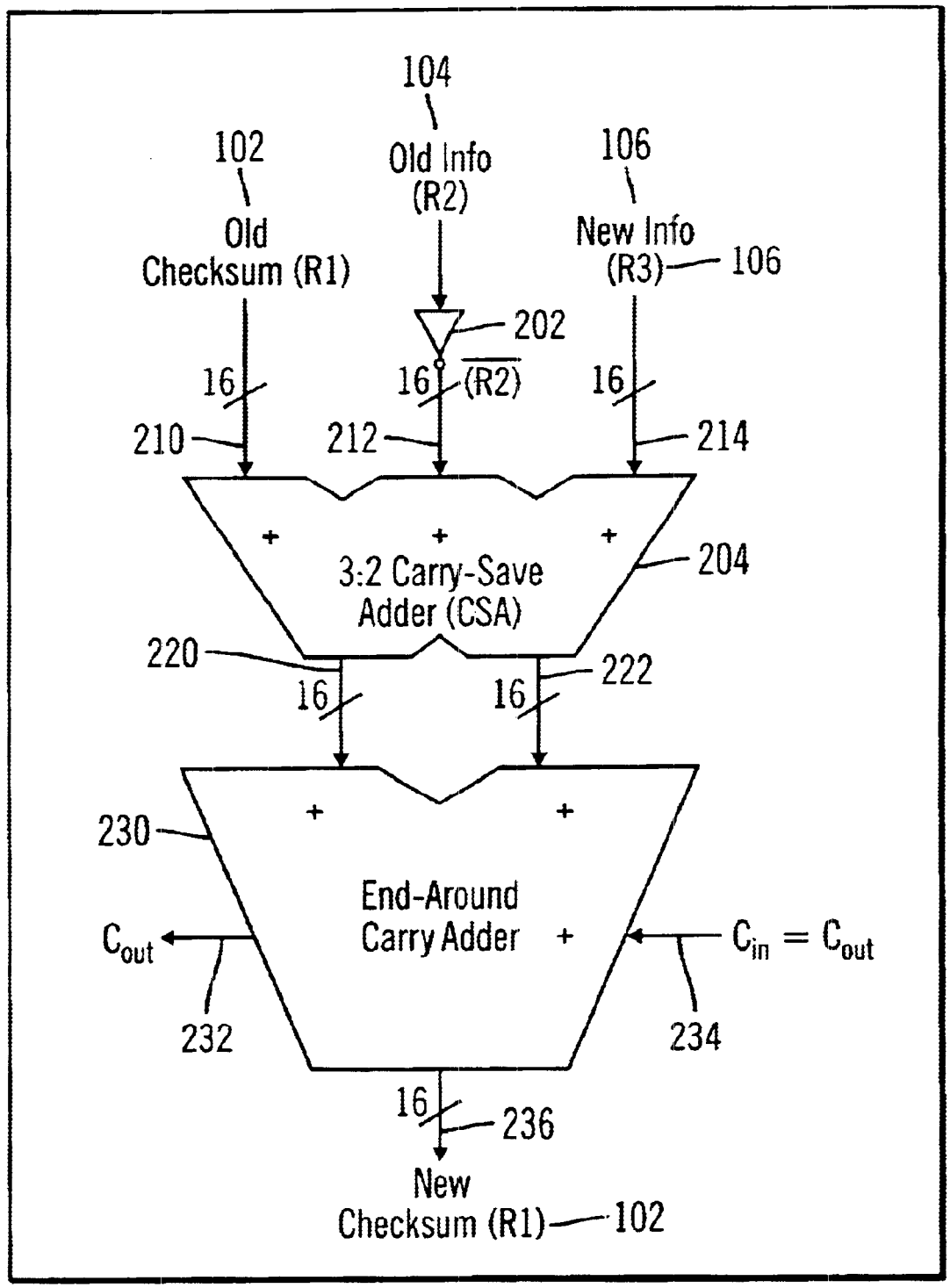
FIG. 2 is a more detailed circuit block diagram illustrating a more detailed view of the incremental checksum computing device shown in FIG. 1, according to a preferred embodiment of the present invention.

FIG. 2 shows a more detailed view of the incremental checksum device 100 of FIG. 1. According to a preferred embodiment of the present invention, the device 100 is part of a circuit disposed in a circuit supporting substrate and preferably that comprises an integrated circuit. Preferably, the device 100 may be part of a processor circuit residing along with a processor in an integrated circuit. This circuit arrangement would enhance the benefits of high speed computation of incremental checksums while minimizing the power consumption of the incremental checksum device 100 and related circuit. The incremental checksum device 100, as has been discussed above, is electrically coupled to the three registers, i.e., register one 102 (with old checksum), register two 104 (with old info), and register three 106 (with new info). The three registers 102, 104, 106, specifically, are electrically coupled to the three inputs 210, 212, 214, of a 3-by-2 Carry-Save-Adder (CSA) 204, as shown. Note that the register two 104 is first electrically coupled to an inverter 202 and then the output of the inverter 202 is electrically coupled to the second input 212 of the CSA 204. That is, the contents of the register two 104 is first inverted to make it a negative number before summing it in the 3-by-2 Carry-Save-Adder (CSA) 204. Although the 3-by-2 CSA 204 in this example is shown using 16 bit data paths, in view of the present discussion, it should become obvious to those of ordinary skill in the art that the data path can be selected to be any desired bit width according to a particular application.

The three values from the three registers 102, 104, 106, which are 16 bits each in this example, will be added into the 3-by-2 CSA 204, resulting in two outputs 220, 222. The two outputs comprise a sum value and a carry value. These two outputs 220, 222, of the 3-by-2 CSA 204 are also 16 bits each. The two outputs 220, 222, are electrically coupled to two inputs of an End-Around Carry Adder 230. The basic structure and operation of the End-Around Carry Adder 230 is well know to those of ordinary skill in the art. The End-Around Carry Adder 230 includes a carry-in input 234 that is electrically coupled to the carry-out output 232 of the End-Around Carry Adder 230. The result output 236 from this End-Around Carry Adder 230 is the new checksum value. This new checksum value, in this example, is electrically coupled from the output 236 of the End-Around Carry Adder 230 to the register one 102. According to a preferred embodiment of the present invention, the output 236 with the new checksum value can be selectively coupled to the register one 102, as may be selected by a processor that operates with the incremental checksum circuit 100. Certainly, alternative memory devices to store the new checksum value may be contemplated by those of ordinary skill in the art in view of the discussion above.

Figures 3, 4:
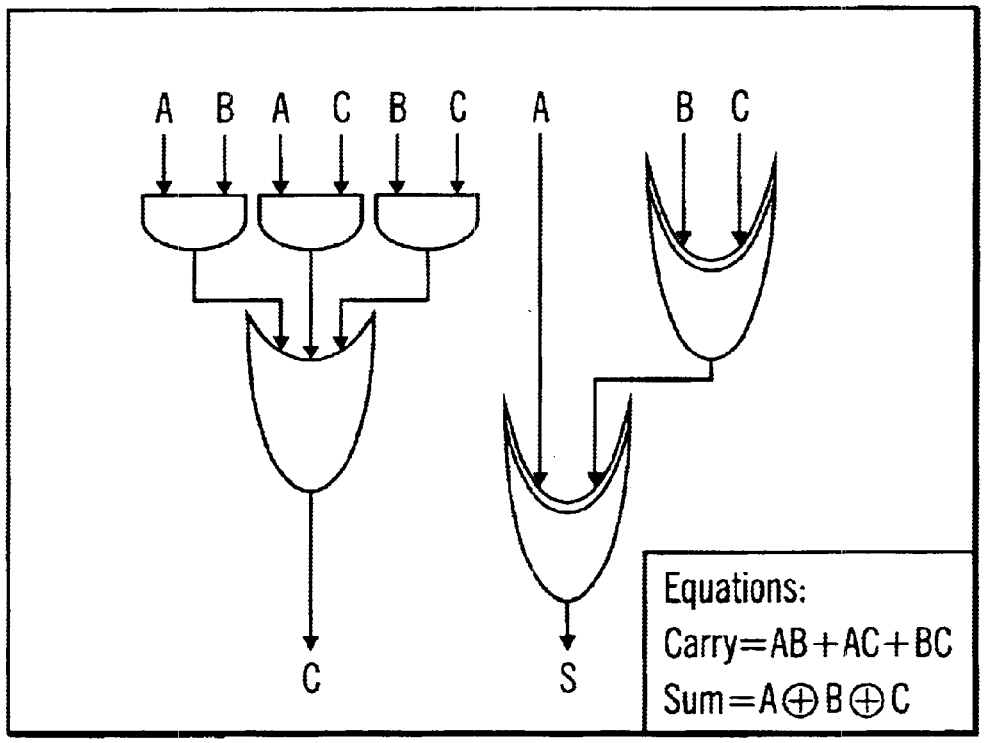
FIG. 3 is a truth table showing the input to output relationship of a 3-by-2 Carry-Save-Adder.
FIG. 4 is a circuit block diagram and associated Boolean logic equation illustrating the structure and operation of the 3-by-2 Carry-Save-Adder.

FIG. 3 shows a truth table (Table 1) for a 3-by-2 Carry-Save-Adder, such as can be used in the 3-by-2 CSA 204. FIG. 4 illustrates the logic circuit blocks constituting a 3-by-2 Carry-Save-Adder, and the associated Boolean equations that are also represented by the truth table shown in Table 1. The Boolean equations shown in FIG. 4 can be easily derived from the truth table in Table 1. Input to such a 3-by-2 CSA is three bits, which generates Sum and Carry output. The basic structure and operation of a 3-by-2 Carry-Save-Adder is well know to those of ordinary skill in the art. In the case of the 16 bit wide 3-by-2 CSA 204, there would be sixteen times the CSA logic blocks shown in FIG. 4.

Figure 5:
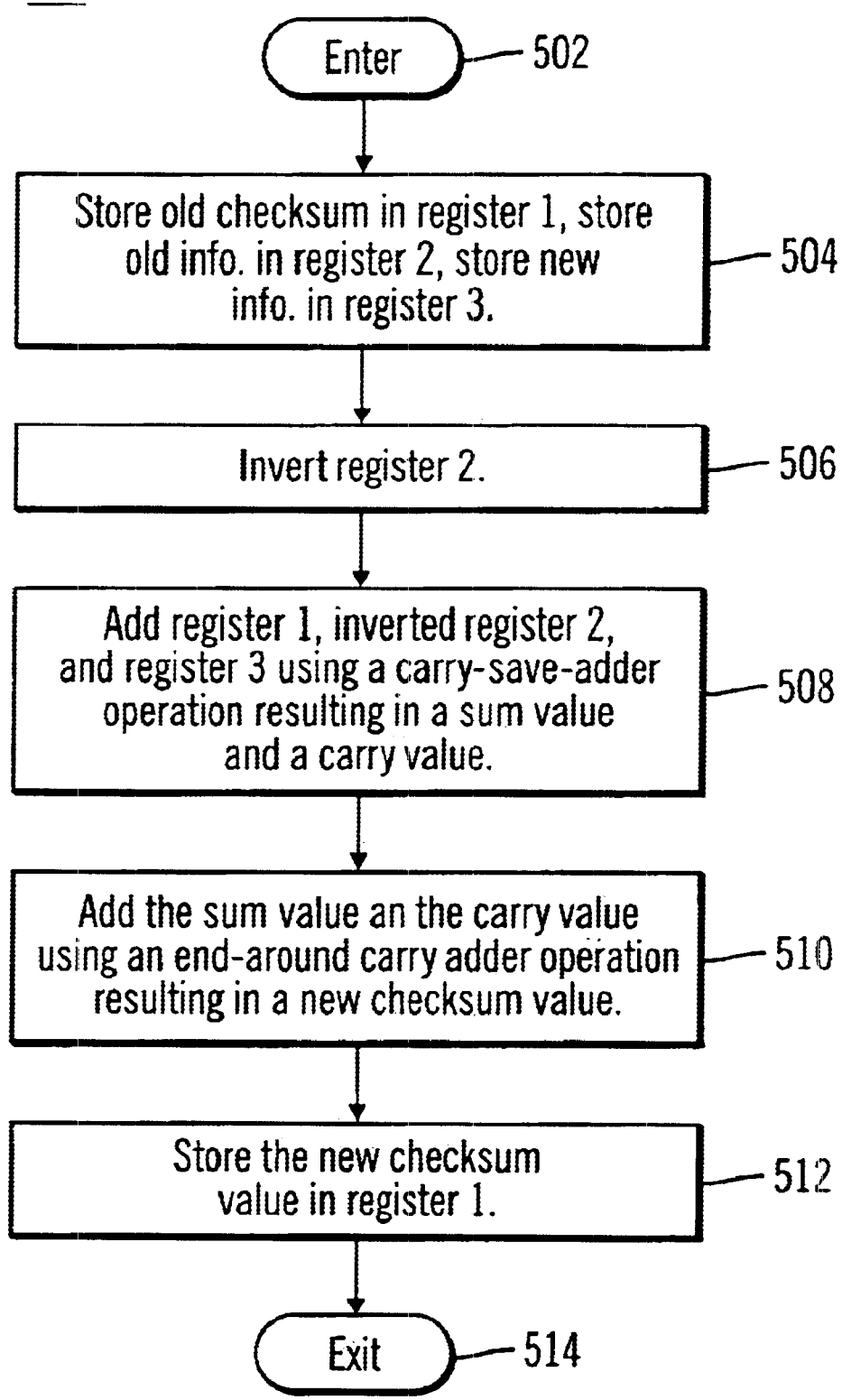
FIG. 5 is flow diagram showing an operational sequence for a computing device utilizing an incremental checksum operation according to a preferred embodiment of the present invention.

FIG. 5 illustrates an exemplary method 500 followed by a computing device that includes a preferred embodiment of the present invention for performing an incremental checksum operation. First, at step 502, the computing device enters a process 500 for computing an incremental checksum. At step 504, a first register 102 stores a checksum corresponding to a data packet before performing an incremental checksum operation. As discussed above, a data packet should be broadly defined to include any type of data structure that represents a collection of data and for which an integrity check is maintained by using a checksum. Continuing on at step 504, a second register 104 stores checksum information corresponding to old information being deleted from the data packet. Additionally, a third register 106 stores checksum information corresponding to new information being added to the data packet. Then, at step 506, the content of the second register 104 is inverted. Recall that this inverting operation makes a negative value of the checksum information from the second register 104, i.e., the checksum information corresponding to old information being deleted from the data packet.

Next, at step 508, a carry-save-adder operation adds the content of register one 102, the inverted content of register two 104, and the content of register three 106, to provide a resulting sum value and a carry value. Then, at step 510, the sum value and the carry value are added by an end-around carry adder operation. Lastly, at steps 512, 514, the process 500 provides the new checksum value by storing it in register one 102, and exiting the process 500. According to the preferred embodiment of the present invention, the novel method 500 can be performed in a single processor cycle. This is a significant advantage of the present invention. It is particularly useful for high speed computing systems, such as for processing data packets in a high speed communication network. For example, an IP router on the Internet would significantly benefit from including the preferred embodiment of the present invention to handle high speed incremental checksums of data packets being routed through the IP router.

As discussed above, the preferred embodiments of the present invention provide a very fast and efficient mechanism for computing an incremental checksum corresponding to a data packet. The very fast incremental checksum operation is particularly useful for high speed computing systems and high speed communication systems, where incremental checksum operations are a basic system operation that must be regularly performed at the maximum speed possible. In communication systems where data packets need incremental checksum while being repeated across a high speed network, any significant delays in computing incremental checksums would detrimentally impact the commercial viability of such communication systems. To maintain a communication throughput all incremental checksum operations should be preferably performed at nearly the speed of the bit rate of delivering data packets. The preferred embodiments of the present invention, as discussed above, allow such computing systems to meet the stringent constraints for high speed performance demanded, for example, by applications for computing incremental checksums of data packets being delivered across a high speed communication network.

Although specific embodiments of the invention have been disclosed, those having ordinary skill in the art will understand that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. A method in a computing system for computing an incremental checksum comprising the steps of:
   storing first checksum information corresponding to a data packet;
   storing second checksum information corresponding to old information being deleted from the data packet;
   storing third checksum information corresponding to new information being added to the data packet;
   inverting the second checksum information;
   adding the first checksum information, the inverted second checksum information, and the third checksum information, by a carry-save-adder operation that results in a sum value and a carry value; and
   adding the sum value and the carry value by an end-around carry adder operation that results in checksum information corresponding to the data packet after deleting the old information from the data packet and adding the new information to the data packet.

2. The method of claim 1, wherein
   the step of inverting the second checksum information,
   the step of adding the first checksum information, the inverted second checksum information, and the third checksum information, by a carry-save-adder operation, and
   the step of adding the sum value and the carry value by an end-around carry adder operation resulting in the checksum information corresponding to the data packet after deleting the old information from the data packet and adding the new information to the data packet, are collectively performed within one processor cycle of a processor for the computing system.

3. A circuit comprising:
   a first memory for storing first checksum information corresponding to a data packet;
   a second memory for storing second checksum information corresponding to old information being deleted from the data packet;
   a third memory for storing third checksum information corresponding to new information being added to the data packet;
   an incremental checksum circuit, electrically coupled to the first memory, the second memory, and the third memory, for providing resulting checksum information corresponding to the data packet after deleting the old information from the data packet and adding the new information to the data packet.

4. The circuit of claim 3, wherein the incremental checksum circuit comprises:
   an inverter circuit, electrically coupled to the second memory, for inverting the second checksum information;
   a carry-save-adder circuit, electrically coupled to the first memory, to the third memory, and to at least one of the second memory and the inverter circuit, for adding the first checksum information, the inverted second checksum information, and the third checksum information, to provide a resulting sum value and a carry value; and
   an end-around carry adder circuit, electrically coupled to the carry-save-adder circuit, for adding the sum value and the carry value to provide the resulting checksum information corresponding to the data packet after deleting the old information from the data packet and adding the new information to the data packet.

5. The circuit of claim 3, wherein the incremental checksum circuit operates to provide the resulting checksum information corresponding to the data packet after deleting the old information from the data packet and adding the new information to the data packet within a processor cycle of a processor that operates with the incremental checksum circuit.

6. The circuit of claim 3, wherein the incremental checksum circuit is disposed on a circuit supporting substrate.

7. The circuit of claim 6, wherein the circuit supporting substrate comprises an integrated circuit.

8. The circuit of claim 6, wherein the incremental checksum circuit is disposed on the circuit supporting substrate along with a processor also being disposed thereon and that operates with the incremental checksum circuit.

9. The circuit of claim 8, wherein the circuit supporting substrate comprises an integrated circuit that includes the processor and the incremental checksum circuit.

10. The incremental checksum circuit of claim 8, wherein each of the first memory, the second memory, and the third memory, comprises a register for the processor.

11. A computing system comprising:
    a processor;
    a first memory for storing first checksum information corresponding to a data packet;
    a second memory for storing second checksum information corresponding to old information being deleted from the data packet;
    a third memory for storing third checksum information corresponding to new information being added to the data packet; and
    an incremental checksum circuit, electrically coupled to the first memory, to the second memory, and to the third memory, for providing resulting checksum information corresponding to the data packet after deleting the old information from the data packet and adding the new information to the data packet.

12. The computing system of claim 11, wherein the incremental checksum circuit operates to provide the resulting checksum information corresponding to the data packet after deleting the old information from the data packet and adding the new information to the data packet within a processor cycle of the processor.

13. The computing system of claim 11, wherein the incremental checksum circuit comprises:
- an inverter circuit, electrically coupled to the second memory, for inverting the second checksum information;
- a carry-save-adder circuit, electrically coupled to the first memory, to the third memory, and to at least one of the second memory and the inverter circuit, for adding the first checksum information, the inverted second checksum information, and the third checksum information, to provide a resulting sum value and a carry value; and
- an end-around carry adder circuit, electrically coupled to the carry-save-adder circuit, for adding the sum value and the carry value to provide the resulting checksum information corresponding to the data packet after deleting the old information from the data packet and adding the new information to the data packet.

14. The computing system of claim 11, wherein each of the first memory, the second memory, and the third memory, comprises a register for the processor.

15. The computing system of claim 11, wherein the processor, the first memory, the second memory, and the third memory, and the incremental checksum circuit, are collectively disposed on a circuit supporting substrate.

16. The computing system of claim 15, wherein the circuit supporting substrate comprises an integrated circuit, and wherein the processor, the first memory, the second memory, and the third memory, and the incremental checksum circuit, are collectively located in the integrated circuit.

17. A communication system comprising:
- a communication network; and
- a data packet router, communicatively coupled to the communication network, for routing data packets across the communication network, the data packet router comprising:
  - a processor;
  - a first memory, electrically coupled to the processor, for storing first checksum information corresponding to a data packet;
  - a second memory, electrically coupled to the processor, for storing second checksum information corresponding to old information being deleted from the data packet;
  - a third memory, electrically coupled to the processor, for storing third checksum information corresponding to new information being added to the data packet; and
  - an incremental checksum circuit, electrically coupled to the first memory, the second memory, and the third memory, for providing resulting checksum information corresponding to the data packet after deleting the old information from the data packet and adding the new information to the data packet.

18. The communication system of claim 17, wherein the incremental checksum circuit operates to provide the resulting checksum information corresponding to the data packet after deleting the old information from the data packet and adding the new information to the data packet within a processor cycle of the processor.

19. The communication system of claim 17, wherein the incremental checksum circuit comprises:
- an inverter circuit, electrically coupled to the second memory, for inverting the second checksum information;
- a carry-save-adder circuit, electrically coupled to the first memory, to the third memory, and to at least one of the second memory and the inverter circuit, for adding the first checksum information, the inverted second checksum information, and the third checksum information, to provide a resulting sum value and a carry value; and
- an end-around carry adder circuit, electrically coupled to the carry-save-adder circuit, for adding the sum value and the carry value to provide the resulting checksum information corresponding to the data packet after deleting the old information from the data packet and adding the new information to the data packet.

20. The communication system of claim 17, wherein the processor, the first memory, the second memory, and the third memory, and the incremental checksum circuit, are collectively located in an integrated circuit.

* * * * *